United States Patent
Yoshida et al.

(10) Patent No.: US 7,254,150 B2
(45) Date of Patent: Aug. 7, 2007

(54) CIRCULAR POLARIZATION SPIN SEMICONDUCTOR LASER USING MAGNETIC SEMICONDUCTOR AND LASER BEAM GENERATING METHOD

(75) Inventors: Hiroshi Yoshida, Hyogo (JP); Kazunori Sato, Osaka (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 291 days.

(21) Appl. No.: 10/502,542

(22) PCT Filed: Jan. 27, 2003

(86) PCT No.: PCT/JP03/00748

§ 371 (c)(1),
(2), (4) Date: Feb. 1, 2005

(87) PCT Pub. No.: WO03/065525

PCT Pub. Date: Aug. 7, 2003

(65) Prior Publication Data

US 2005/0117617 A1 Jun. 2, 2005

(30) Foreign Application Priority Data

Jan. 29, 2002 (JP) ............................. 2002-019409

(51) Int. Cl.
*H01S 3/10* (2006.01)
*H01S 5/00* (2006.01)
(52) U.S. Cl. ..................................... 372/43.01; 372/27
(58) Field of Classification Search ................. 372/27, 372/43.01, 50.1
See application file for complete search history.

(56) References Cited

U.S. PATENT DOCUMENTS

| 3,986,194 A | 10/1976 | Masumoto et al. |
| 5,874,749 A | 2/1999 | Jonker |
| 6,043,515 A | 3/2000 | Kamiguchi et al. |

FOREIGN PATENT DOCUMENTS

JP 06-260725 9/1994

(Continued)

OTHER PUBLICATIONS

H. Yoshida et al.; Journal of the Crystallographic Society of Japan, vol. 27, No. 4, pp. 86-94. Cited in the int'l. search report.
K. Sato et al.; The Japan Society of Applied Physics, vol. 40, Part.2, No. 4A, pp. L334-L336, Apr. 1, 2001. Cited in the int'l. search report.

(Continued)

*Primary Examiner*—Armando Rodriguez
(74) *Attorney, Agent, or Firm*—Westerman, Hattori, Daniels & Adrian, LLP.

(57) ABSTRACT

Disclosed is a spin-based semiconductor laser source capable of generating a completely circularly polarized laser light by injecting current into p-type and n-type half-metal magnetic semiconductor layers. Each of the p-type and n-type half-metal magnetic semiconductor layers is prepared by doping a magnetic semiconductor with a transition metal atom and optionally with an acceptor or donor. Alternatively, each of the p-type and n-type half-metal magnetic semiconductor layers is prepared by providing a gate to a magnetic semiconductor and adjusting/controlling its ferromagnetic state according to the field effect. The present invention can solve the problem concerning the insufficient degree of circular polarization in conventional circular-polarization semiconductor laser sources.

14 Claims, 4 Drawing Sheets

FOREIGN PATENT DOCUMENTS

| | | |
|---|---|---|
| JP | 9-219564 | 8/1997 |
| JP | 09-293924 | 11/1997 |
| JP | 10-321964 | 12/1998 |

OTHER PUBLICATIONS

H. Ando et al.; Appl. Phys. Ltr. 73 (1998) 566. Cited in the specification.

CIRCULAR POLARIZATION SPIN SEMICONDUCTOR LASER USING MAGNETIC SEMICONDUCTOR AND LASER BEAM GENERATING METHOD

TECHNICAL FIELD

The present invention relates to a circularly polarized light-generating spin-based semiconductor laser source using a magnetic semiconductor, and a method of generating a laser light using the laser source.

BACKGROUND ART

A semiconductor laser source has excellent compactness and conformance to highly integrated semiconductor devices. In late years, a wide-bandgap semiconductor material opens the way for developments of higher-power semiconductor laser sources with an oscillation wavelength of up to the ultraviolet range.

A magnetic-semiconductor laser source has been known for quite some time (for example, the following Patent Publication 1). There has also been known a semiconductor laser source capable of generating a circularly polarized laser light having a specific polarization direction.

For example, the following Patent Publication 2 discloses an optical semiconductor device in which an electrode made of magnetic material or magnetic electrode is provided on the upper or lower side or on both upper and lower sides of a semiconductor element with a p-n or p-i-n structure having an active region therein, and a spin-polarized electron or hole is injected into the active region through the magnetic electrode.

The following Patent Publication 3 discloses another optical semiconductor device in which a spin-polarized electron is injected into semiconductor layers forming a heterojunction, through a magnetic layer to induce the recombination between the injected spin-polarized electron and an unpolarized hole so as to oscillate a circularly polarized light. This device is intended to modulate the polarization state of an incoming light by inducing the magnetization reversal in a magnetic material using an external magnetic field.

The following Patent Publication 4 discloses still another optical semiconductor device in which a ferromagnetic layer is joined to at least one of a p-type contact layer and an n-type contact layer to facilitate the creation of carrier population inversion in an active region.

Further, the following Non-Patent Publication 1 discloses a spin-control semiconductor laser source in which either one of two excitation lights formed as right-handed (σ+) and left-handed circularly polarized lights using a wavelength plate is selectively emitted onto a conventional surface-emitting semiconductor laser source to allow the laser source to oscillate two kinds of circularly polarized laser lights.

Patent Publication 1: U.S. Pat. No. 3,986,194—specification and drawings—(Japanese Parent Publication No. 52-36832)

Patent Publication 2: Japanese Parent Laid-Open Publication No. 06-260725 (Japanese Patent No. 2708085)

Patent Publication 3: U.S. Pat. No. 5,874,749—specification and drawings—(Japanese Parent Laid-Open Publication No. 09-501266)

Patent Publication 4: Japanese Parent Laid-Open Publication No. 10-321964

Non-Patent Publication 1: H. Ando, et al. Appl. Phys. Lett. 73 (1998) 566

DISCLOSURE OF INVENTION

Despite expectations to various industrial uses of a circularly polarized light-generating spin-based semiconductor laser source (hereinafter referred to as "circular-polarization spin-based semiconductor laser source"), such as applications to production technologies, information/communications technologies, spectroscopies, nanotechnologies or quantum manipulations, any high-power circularly polarized laser light based on current injection has not been obtained, because it has been unable to prepare a completely (or 100%) spin-polarized p-type or n-type semiconductor.

The development of circular-polarization spin-based semiconductor laser sources cannot be realized without a technique for preparing a laser structure in which the respective spins of an electron and a hole to be injected are in an anti-parallel relationship, provided the conduction band and valence band of a semiconductor is an s-electron band and p-electron band, respectively. If such a structure is prepared, a light to be generated therefrom can be completely circularly polarized according to the selection rule for a dipole transition mechanism.

In view of the above circumstances, it is therefore an object of the present invention to provide a technique of forming p-type and n-type half-metal ferromagnetic semiconductors meeting the above selection rule and arranging these semiconductors, respectively, on the opposite surfaces of an active layer so as to develop a practicable circular-polarization spin-based semiconductor laser source.

In the development of the circular-polarization spin-based semiconductor laser source, it is necessary to prepare a p-n junction laser structure in consideration of the anti-parallel relationship between an electron to be injected from the n-type magnetic semiconductor and a hole to be injected from the p-type magnetic semiconductor, and adjust a laser light to be generated therefrom, according the dipole-transition selection rule, so as to provide a completely circularly polarized light.

Through various researches for achieve the above object, the inventers found that a current is injected into an active layer having a multi-quantum well structure interposed between a p-type half-metal (all magnetic moments align in one specific direction) ferromagnetic semiconductor layer and an n-type half-metal ferromagnetic semiconductor layer, to allow the p-type and n-type ferromagnetic semiconductor layers to go into a complete (or 100%) up-spin state and a complete down-spin state, respectively, so that a completely (100%) circularly polarized light-generating spin-based semiconductor laser source can be obtained to achieve the above object.

The emission wavelength of the circular-polarization spin-based semiconductor laser can be freely controlled by adjusting the bandgap based on mixed crystallization in the ferromagnetic semiconductors, the superlattice period and the width of the active layer, the intensity of an external magnetic field or the like.

Specifically, according to a first aspect of the present invention, there is provided a circular-polarization spin-based semiconductor laser source using a magnetic semiconductor. The semiconductor laser source comprises: a pair of p-type and n-type half-metal ferromagnetic semiconductor layers each made of a magnetic semiconductor which has a matrix consisting of either one of zinc oxide (ZnO), group III-V compound semiconductor and group II-VI compound semiconductor, and contains a transition metal atom; an active layer having a multi-quantum well structure interposed between the p-type and n-type half-metal ferromagnetic semiconductor layers; and means for allowing a spin-polarized hole and a spin-polarized electron to be introduced into the active layer through current injection.

In the above spin-based semiconductor laser source, each of the p-type and n-type half-metal ferromagnetic semiconductor layers may has a source and drain provided thereon, and a gate provided thereto through an insulating layer.

In the above spin-based semiconductor laser source, each of the p-type and n-type half-metal ferromagnetic semiconductor layers may has an electrode provided thereon.

According to a second aspect of the present invention, there is provided a method of generating a laser light. This method comprises: preparing the spin-based semiconductor laser source set forth the first aspect of the present invention; and applying a different one of negative and positive voltages to the p-type and n-type half-metal ferromagnetic semiconductor layers to form a hole spin-polarized in a forward direction and an electron spin-polarized in a backward direction, respectively in the p-type and n-type half-metal ferromagnetic semiconductor layers, and inject the hole and electron into the active layer therefrom so as to cause the recombination between the hole and electron in the active layer to generate a circularly polarized laser light from the semiconductor laser source.

In the method set forth in the second aspect of the present invention, the voltage to be applied may be varied to control the degree of spin polarization in each of the p-type and n-type half-metal ferromagnetic semiconductor layers so as to control the output energy and polarization degree of the circularly polarized laser light.

In the method set forth in the second aspect of the present invention, when each of the p-type and n-type half-metal ferromagnetic semiconductor layers is provided with a gate, source and drain, the magnitude of at least either one of the spin-polarized hole and electron flowing between the source and drain may be varied to adjust/control the output energy of the circularly polarized laser light.

The method set forth in the second aspect of the present invention may include applying an external magnetic field to the semiconductor laser source to control the emission wavelength of the circularly polarized laser light.

The method set forth in the second aspect of the present invention may include varying the voltage to be applied, to control the emission wavelength of the circularly polarized laser light.

In the method set forth in the second aspect of the present invention, when the laser source includes a superlattice structure in the barrier height of a spin-cladding layer disposed on a portion of each of the p-type and n-type half-metal ferromagnetic semiconductor layers adjacent to the active layer, the superlattice structure may be adjusted to control the emission wavelength of the circularly polarized laser light.

The method set forth in the second aspect of the present invention may include adjusting the well width of the multi-quantum well structure and the voltage to be applied, to change the value g of the electron spin so as to vary the intensity of an external magnetic field applied the semiconductor laser source, to control the emission wavelength of the circularly polarized laser light.

According to a third aspect of the present invention, there is provided a method of generating a laser light using the aforementioned spin-based semiconductor laser source including the p-type and n-type half-metal ferromagnetic semiconductor layers each having a source and drain provided thereon and a gate provided thereto through an insulating layer. In this case, the source is formed by laminating a half-metal ferromagnetic semiconductor thin film and an antiferromagnetic multilayer film, so that the direction of the magnetic domain thereof is pinned to uniform the respective spin directions of electrons or holes to be injected from the source toward the drain.

According to a third aspect of the present invention, there is provided a method of generating a laser light using the aforementioned spin-based semiconductor laser source including the p-type and n-type half-metal ferromagnetic semiconductor layers each having a source and drain provided thereon and a gate provided thereto through an insulating layer. In this case, the source is made of a half-metal ferromagnetic semiconductor, and provided with a ferromagnetic permanent magnet for controlling the direction of the magnetic domain thereof, so that the direction of the magnetic domain is pinned to uniform the respective spin directions of electrons or holes to be injected from the source toward the drain.

The circular-polarization spin-base semiconductor laser source can be used in various industrial technologies, such as production technologies, information/communications technologies, spectroscopies, nanotechnologies or quantum manipulations. More specifically, the following applications can be expected.

(1) Application to Identification of Isomers in Chemical Reactions and Other Production Technologies A circularly polarized laser light can be used as production technologies for identifying D and L-isomers, and for controlling a reaction for producing only a specific isomer, using the identification technique.

(2) Application to Semiconductor Micro-Fabrication using Selectivity of Circularly Polarized Light In semiconductor micro-fabrications, a laser source for generating a circularly polarized ultraviolet light can be combined with an isomeric reaction to allow the reaction to be controlled in accordance with irradiation time and spatial resolution so as to fabricate a semiconductor in a nano-scale size.

(3) Application to Scanning Spectroscopic Technologies using Selectivity of Circularly Polarized Light The selectivity of circularly polarized light and the linearity/operationality of laser light can be utilized in spectroscopic technologies for directly observing dynamic changes in a chemical reaction of catalysts or the like, or surface structures, based on scanning spectroscopy and spatial resolution.

(4) Application to Medical Diagnosis for Detecting Isomers using Selectivity of Circularly Polarized Light The selectivity of circularly polarized light and the linearity of laser light can be utilized in a medical diagnosis for detecting a specific microscopic isomer region in the early stage of a cataract.

The reaction selectivity of circularly polarized light can also be utilized in a medical treatment and a preventive treatment in the early stage of a disease caused by isomerization, such as cataract or glaucoma, to induce a reaction with a specific isomer so as to decompose the isomer.

(5) Application to Large Volume Advanced Information/Communications Technologies Modulated right-handed/left-handed circularly polarized lights can be used in large volume advanced information/communications technologies.

(6) Application to Atom/Molecule Manipulation Technologies using Circularly Polarized Light-Induced Electron Excitation in Nanotechnologies In nanotechnologies, the selectivity of circularly polarized light relative to surface atoms or adatoms in a semiconductor surface or oxide surface can be used in a micro-fabrication based on atomic migration caused by electron excitation selectively induced using laser light.

Further, the following device applications can be expected.

(7) Application to Diagnosis and Spectroscopy of Ultra-highly Integrated Nanostructured Magnetic Memory The selectivity of circularly polarized light and the linearity of laser light can be utilized in spectroscopic technologies for directory observing ultrafine magnetic domain structures or the magnetic domain structure of an ultra-high-density magnetic memory, a magnetic random access memory (MRAM) or the like.

(8) Application to Quantum Computer based on Quantum State Manipulation in Ultrastructures, such as Quantum Dots, using Circularly Polarized Light The spin as one degree of freedom other than a charge residing in an electron can be used in quantum computing. The spin carries information because it can be only either one of up-spin and down-spin states under the quantum theory. The selectivity of circularly polarized CW (Continuous Wave) laser light can be utilized to control respective spin directions to be contained in a quantum dot array.

(9) Application to Quantum Communication

The circularly polarizing performance of the circular-polarization laser source can be used in a secured quantum communication capable of superimposing two kinds of waves to achieve tangled quantum states so as to allow interactions, such as tapping, to be quantum-theoretically monitored.

(Function of the Invention)

In a semiconductor having a conduction band of s-electrons and a valence band of p-electrons, if the respective spins of an electron and a hole to be injected are in an anti-parallel relationship, a completely circularly polarized light can be obtained according to the selection rule for a dipole transition mechanism.

Based on a magnetic semiconductor prepared by doping either one of ZnO, group II-VI compound semiconductor and group III-V compound semiconductor, with transition metal atoms having a controlled concentration, a pair of p-type and n-type half-metal ferromagnetic semiconductor layers are formed by doping the magnetic semiconductor, respectively, with an acceptor and a donor. Alternatively, the p-type and n-type half-metal ferromagnetic semiconductor layers are designed to have an insulated-gate field effect transistor-like structure and utilize the field effect induced by gate voltages different in magnitude and positive/negative sign. Then, through current injection, a flow of spin-coherent holes polarized in one of spin directions, and a flow of spin-coherent electrons polarized in the other spin direction opposite to that of the holes, are created, respectively, in the p-type and n-type half-metal ferromagnetic semiconductor layers, to combine the electrons and holes which have entered, respectively, into the conduction band and the valence band in opposite spin directions, with high efficiency, through the active layer with a multi-quantum well structure capable of adjusting the bandgap, so that a completely (100%) circularly polarized CW (Continuous Wave) laser light can be generated according to the selection rule.

Figure 1:
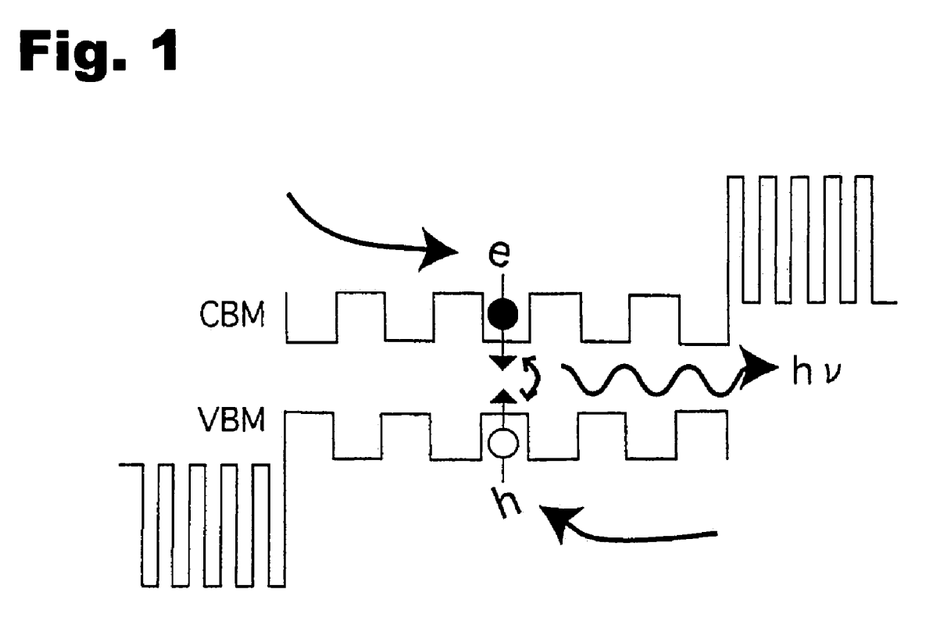
FIG. 1 is an energy diagram of an active layer in a circular-polarization spin-based semiconductor laser source of the present invention.

This function will be described in detail with reference to an energy diagram illustrated in FIG. 1. In FIG. 1, an active layer with a multi-quantum well structure defined by a CBM (Conduction Band Minimum: the bottom of the conduction band) and a VBM (Valence band Maximum: the top of the valence band) and a cladding layer to be disposed on the side of each of p-type and n-type regions are sandwiched between p-type and n-type completely spin-polarized magnetic semiconductor layers. This laser source is designed to generate a light from both the multi-quantum well structure and the cladding layers so as to provide enhanced emission efficiency. A hole h and electron e polarized in opposite spin directions and injected from the p-type and n-type magnetic semiconductor layers as indicated by the arrows can be combined together with high efficiency while maintain them in the opposite spin directions, to generate a completely circularly polarized laser light hv. The enhanced combination between the electron and the hole in an actual space, and the exciton binding energy of ZnO (60 meV), GaN (24 meV) or the like, allow the emission to be performed with high efficiency.

BEST MODE FOR CARRYING OUT THE INVENTION

A circular-polarization spin-based semiconductor laser source according to a first embodiment of the present invention includes a pair of p-type and n-type half-metal ferromagnetic semiconductor layers designed to have an insulated-gate field effect transistor-like structure and utilize the field effect induced by gate voltages different in magnitude and positive/negative sign.

A circular-polarization spin-based semiconductor laser source according to a second embodiment of the present invention includes a pair of p-type and n-type half-metal ferromagnetic semiconductor layers formed by preparing a magnetic semiconductor made of a matrix consisting of either one of ZnO, group II-VI compound semiconductor and group III-V compound semiconductor and doped with a transition metal atom having a controlled concentration, and doping the magnetic semiconductor with an acceptor and a donor, respectively.

The group III-V compound semiconductor as the matrix of the magnetic semiconductor containing a transition metal atom may include GaN, GaAs, GaP, GaSb, InN, InP, InAs, InSb, AlN, AlP, AlAs and AlSb.

The group II-VI compound semiconductor may include ZnS, ZnSe, ZnTe, CdS, CdSe, CdTe, HgS, HgSe and HgTe.

The p-type magnetic semiconductor layer having the matrix made of zinc oxide (ZnO) may be made of either one of ZnO: Mn, ZnO: V and ZnO: Cr; ZnO; and $Mn_{(1-x)}Fe_{(x)}$ and $ZnO:Cr_{(1-x)}Mn_{(x)}$ in a spin glass state. The n-type magnetic semiconductor layer having the matrix made of zinc oxide (ZnO) may be made of either one of ZnO:Fe, ZnO:Co and ZnO:Ni; and ZnO:Mn and $ZnO:Fe_{(1-x)}Mn_{(x)}$ in a spin glass state.

The p-type magnetic semiconductor layer having the matrix made of the group III-V compound semiconductor may be prepared by doping either one of GaN, GaAs, GaP, GaSb, InN, InP, InAs, InSb, AlN, AlP, AlAs and AlSb, with either one of V, Cr, Mn and $Mn_{(1-x)}Fe_{(x)}$. The n-type magnetic semiconductor layer having the matrix made of the group III-V compound semiconductor may be prepared by doping either one of GaN, GaAs, GaP, GaSb, InN, InP, InAs, InSb, AlN, AlP, AlAs and AlSb, with either one of Fe, Co and Ni, and their alloy.

The p-type magnetic semiconductor layer having the matrix made of the group II-VI compound semiconductor may be prepared by doping either one of ZnS, ZnSe, ZnTe, CdS, CdSe, CdTe, HgS, HgSe and HgTe, with either one of V, Cr and Mn. The n-type magnetic semiconductor layer having the matrix made of the group II-VI compound semiconductor may be prepared by doping either one of ZnS, ZnSe, ZnTe, CdS, CdSe, CdTe, HgS, HgSe and HgTe, with either one of Mn, Fe, Co and Ni and their alloy.

A light-emitting active layer with a multi-quantum well structure and a cladding layer to be disposed on the side of each of p-type and n-type regions are sandwiched between the p-type and n-type magnetic semiconductor layers.

A gate is attached to each of the p-type and n-type magnetic semiconductor layers through an insulating film made of $Al_2O_3$ or ZnO, or an electrode is attached directly onto each of the p-type and n-type magnetic semiconductor layers. Then, a current is injected into the p-type and n-type magnetic semiconductor layers through the gates or electrodes. In this manner, a hole and electron polarized in opposite spin directions and injected from the p-type and n-type semiconductor layers can be combined together in the active layer while maintaining them in the opposite spin directions with high efficiency, to generate a completely circularly polarized laser light. The spin state and spin direction of each of hole and electron to be injected are controlled by the change in gate voltage and a source made of a half-metal ferromagnetic semiconductor having a magnetic domain with uniformed direction and disposed on each of the opposite ends of the semiconductor layers.

A completely circularly polarized CW (Continuous Wave) laser light can be obtained by combining hole and electron completely spin-polarized in opposite directions and using a cleaved cavity.

A combination of a low-temperature nonequilibrium crystal growth technology, such as MOCVD, and an atomic-level micro-fabrication technology, is used to dope a matrix made of either one of ZnO, group III-V compound semiconductor and group II-VI compound semiconductor, with a transition metal atom, an acceptor atom, a donor atom and a non-magnetic atom for controlling the bandgap, in a high concentration, e.g. about 10 to 40%, during a nonequilibrium state, while controlling the concentration and the crystallographic positions allowing the atoms to be substituted at correct positions, so as to form each of the p-type and n-type half-metal ferromagnetic semiconductor layers, through mixed crystallization.

The bandgap and/or physical properties of the magnetic semiconductor layers can be controlled by adjusting/selecting the concentration and kind of atom to be used.

Through the doping of the acceptor and/or donor to the magnetic semiconductor layers, the power or out energy and the polarization degree of the circularly polarized leaser light can be controlled/adjusted in the range of 50 to 100%.

The transition metal atom (hereinafter referred to as "TM") to be contained in the magnetic semiconductor and other non-magnetic atom can be combined in the form of a mixed crystal to control the wavelength of emission from the circular-polarization spin-based semiconductor laser. For example, the emission wavelength may be controlled by the concentration of non-magnetic atom to be crystallized with the transition metal atom, in such a manner as $In_{(x)}Ga_{(y)}Al_{(z)}N:TM_{(1-x-y-z)}$, $Zn_{(x)}Mg_{(y)}O:TM_{(1-x-y)}$ or $Zn_{(x)}Be_{(y)}O:TM_{(1-x-y)}$.

An external magnetic filed can be applied to the circular-polarization spin-based semiconductor laser to control the wavelength of emission therefrom. Further, the well width of the multi-quantum well structure in the active layer and the gate voltage can be adjusted to change the value g of electron spin so as to vary the intensity of the external magnetic field to control the wavelength of emission from the circular-polarization spin-based semiconductor laser source.

While the higher level of multiplicity in the multi-quantum well structure of the active layer provides higher emission efficiency, excessive multiplicity causes complicated production process. Thus, it is preferable to improve the emission efficiency by optimizing the well width while limiting the multiplicity in the range of 1 to 5.

In the circular-polarization spin-based semiconductor laser source, the barrier height of a spin-cladding layer disposed on a portion of each of the p-type and n-type magnetic semiconductor layers adjacent to the active layer can be formed as alloy (mixed crystal) over the barrier height thereof to provide a superlattice structure. In this case, the superlattice structure can be adjusted to control the wavelength of emission from the circular-polarization spin-based semiconductor laser source.

In case where a gate is attached to each of the magnetic semiconductor layers through an insulating film, and the gate voltage is varied to control the magnetic state based on the field effect, the magnitude and/or positive/negative sign of the gate voltage can be controlled to perform a spin control in the magnetic semiconductor layers so as to combine a hole spin-polarized in a forward direction and injected from the p-type half-metal ferromagnetic semiconductor layer, an electron spin-polarized in a backward direction and injected from the n-type half-metal ferromagnetic semiconductor layer, with high efficiency in the active layer with a multi-quantum well structure composed of the quantum well and the cladding layer.

The gate voltage can be varied to control the degree of spin polarization in each of the p-type and n-type half-metal ferromagnetic semiconductor layers so as to control the output energy and polarization degree of the circularly polarized laser light, for example, in the range of 50 to 100%.

Further, in response to the alternation of the gate voltage, the number of carriers and the bandgap are varied to change the wavelength of emission from the circular-polarization spin-based semiconductor laser source.

The gate-voltage control for changing the level of spin-polarized holes and electrons to flow between the source and the drain allows the output energy or power of the circularly polarized laser light to be adjusted/controlled.

The source can be formed by superimposing a ferromagnetic layer on an antiferromagnetic multilayer to pin the spin direction therein so as to uniform the respective spin directions of electrons or holes to be injected from the source toward the drain.

Further, the source can be made of a half-metal ferromagnetic semiconductor, and provided with a ferromagnetic permanent magnet for controlling the direction of the magnetic domain thereof, to pin the direction of the magnetic domain so as to uniform the respective spin directions of electrons or holes to be injected from the source toward the drain.

EMBODIMENT

First Embodiment

Figure 2:
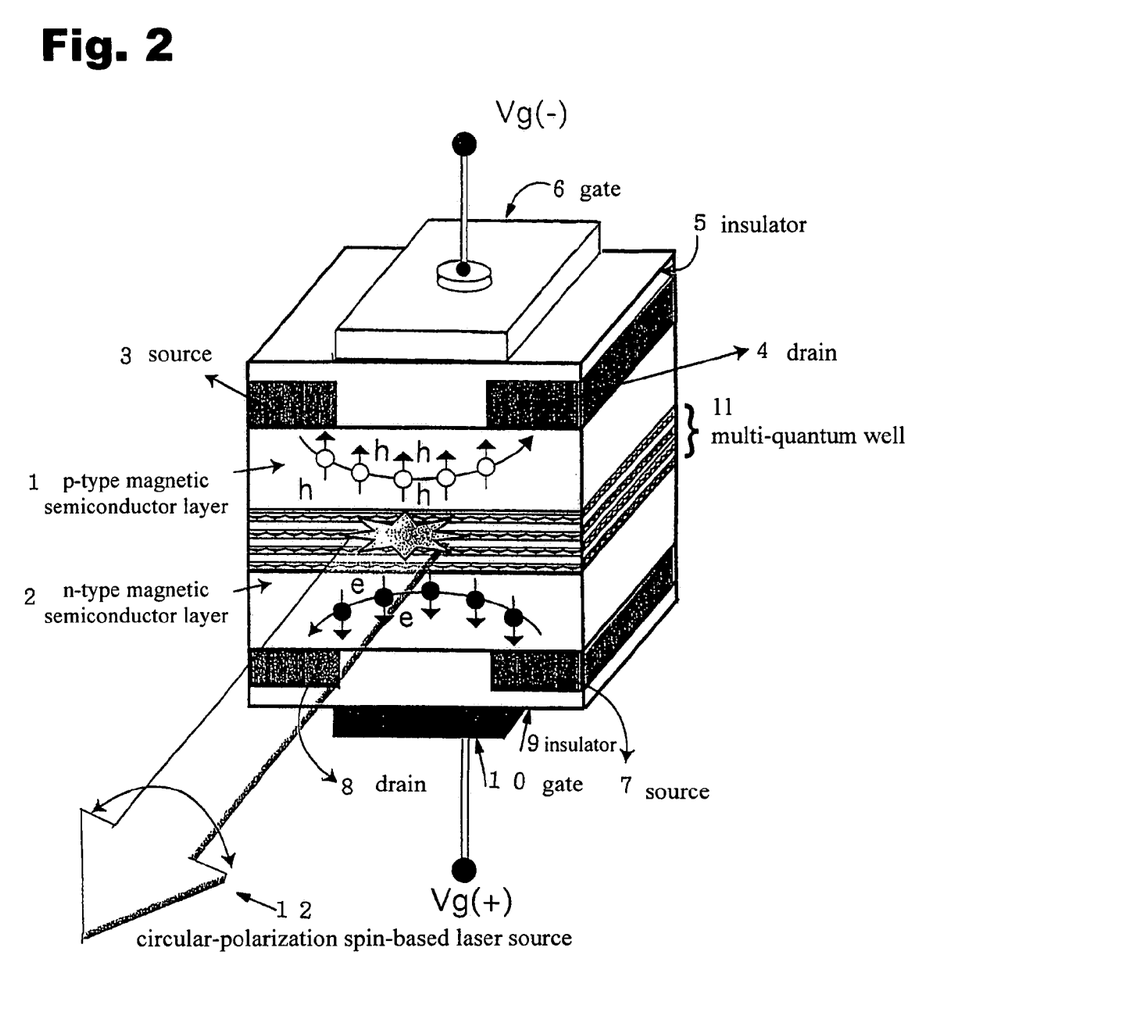
FIG. 2 is a schematic diagram showing the structure of a valence-electron control type circular-polarization spin-based semiconductor laser source using a gate for controlling valence electrons through the field effect, according to a first embodiment of the present invention.

FIG. 2 is a schematic diagram showing the structure of the current-injection type circular-polarization spin-based semiconductor laser source 1 utilizing the field effect induced by a gate bias, according to the first embodiment of the present invention.

As shown in FIG. 2, a source 3, a drain 4 and a gate insulator 5 are provided on the upper surface of a p-type half-metal ferromagnetic semiconductor layer 1, and a gate 6 is provided on the gate insulator 5 in a contact manner. In this manner, the p-type half-metal ferromagnetic semiconductor layer (p-type DMS layer) 1 is operable, in response to the gate voltage, to receive holes and inject the holes all of which have spins uniformed in one direction based on its ferromagnetic half-metal state, from the source having a spin domain direction pinned by a magnetic field or an antiferromagnetic superlattice thin film.

A source 7, a drain 8 and a gate insulator 9 are provided on the lower surface of an n-type half-metal ferromagnetic semiconductor layer 2, and a gate 10 is provided to the semiconductor layer 2 through the gate insulator 9. In this manner, the n-type half-metal ferromagnetic semiconductor layer (n-type DMS layer) 2 is operable, in response to the gate voltage, to receive electrons and inject the electrons all of which have spins uniformed in one direction based on its ferromagnetic half-metal state, from the source having a spin domain direction pinned by a magnetic field or an antiferromagnetic superlattice thin film. The interface between each of the gate insulators 5, 9 and each of the p-type and n-type magnetic semiconductor layers 1, 2 are formed without any defect. An active layer with a multi-quantum well structure 11 including a quantum well and a cladding layer and having a small bandgap is interposed between the p-type and n-type ferromagnetic magnetic semiconductor layers 1, 2.

Specifically, through a MBE (Molecular Beam Epitaxy) Process, an n-type half-metal ferromagnetic semiconductor layer was formed by doping GaN with Cr at 750° C., and a p-type half-metal ferromagnetic semiconductor layer was formed by doping each of GaN with Mn at 780° C. Then, a gate (gate voltage: Vg) made of Pt was attached onto each of the n-type and p-type semiconductor layer while interposing a gate insulating layer made of $Al_2O_3$ therebetween. Then, an active layer with a multi (quintuple)-quantum well structure made of InGaN and AlGaN doped with 5 to 20% of In or Al was formed between the n-type semiconductor layer of GaN:Cr and the p-type semiconductor layer of GaN:Mn. A p-type cladding layer was formed as a multi-quantum well made of GaN and $Al_{0.25}Ga_{0.75}N$, and an n-type cladding layer was formed as a multi-quantum well made of GaN and $Al_{0.2}Ga_{0.8}N$.

Figure 3:
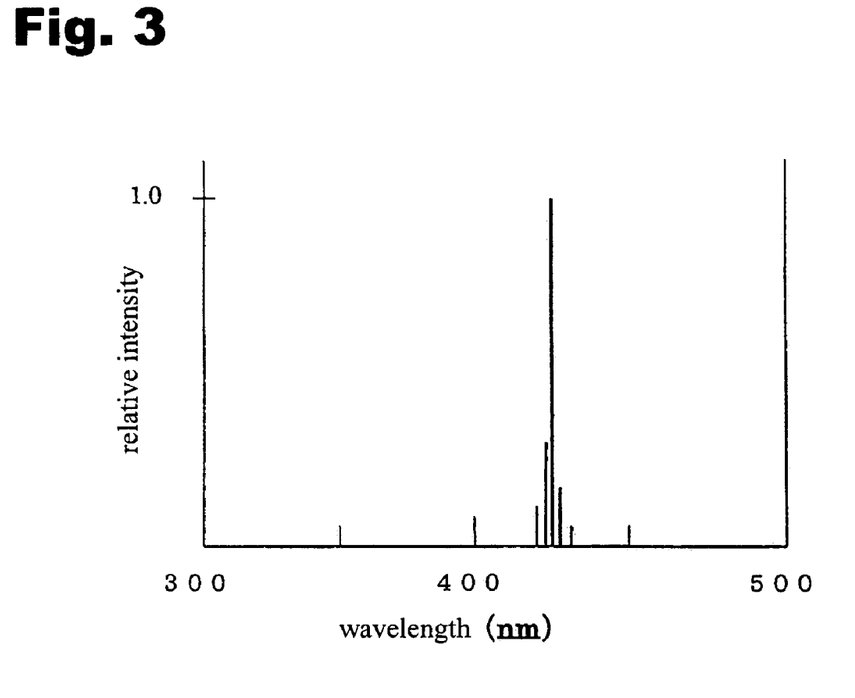
FIG. 3 is a graph showing an oscillation spectrum of the circular-polarization spin-based semiconductor laser source according to the first embodiment.
Figure 4:
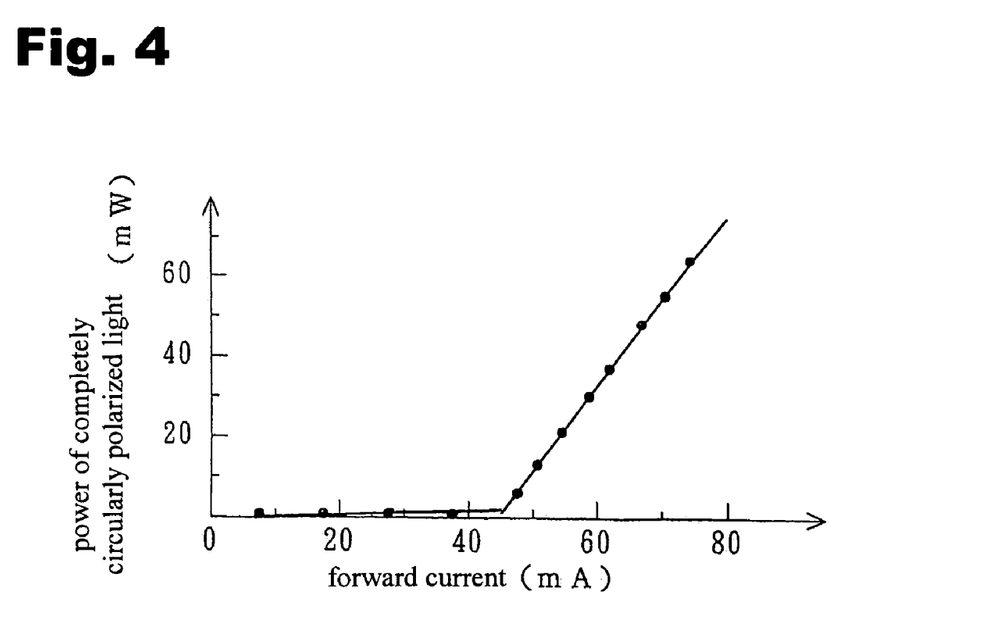
FIG. 4 is a graph showing a current-power characteristic of the circular-polarization spin-based semiconductor laser source according to the first embodiment.

As a result of the laser oscillation of this circular-polarization spin-based semiconductor laser source, a circularly polarized/continuously oscillated laser light 12 was generated, and a completely circularly polarized laser light having an oscillation spectrum as shown in FIG. 3 and a current-power characteristic as shown in FIG. 4 was observed.

Second Embodiment

Figure 5:
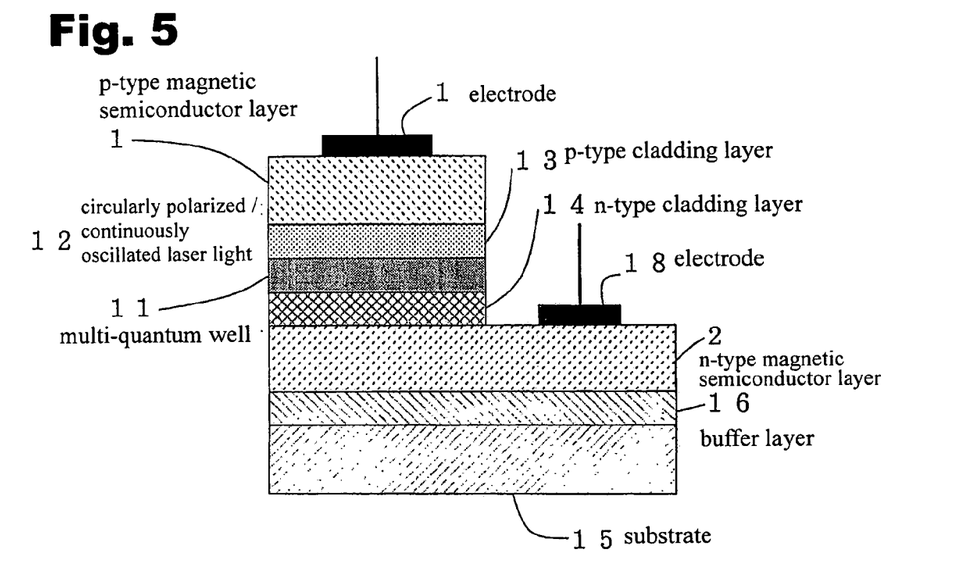
FIG. 5 is a schematic diagram showing the structure of a current-injection type circular-polarization spin-based semiconductor laser source according to a second embodiment of the present invention.

FIG. 5 is a schematic diagram showing the structure of the current-injection type circular-polarization spin-based semiconductor laser source 1 according to the first embodiment of the present invention.

As shown in FIG. 5, an active layer with a multi-quantum well structure 11 is sandwiched by a p-type magnetic semiconductor layer 1 and an n-type magnetic semiconductor layer 2. Further, in order to provide enhanced emission efficiency, a laminated structure is formed by sandwiching the multi-quantum structure 11 between a p-type cladding layer 13 and an n-type cladding layer 14. This laminated structure is provided on a substrate 15 through a buffer layer 16. Further, an electrode 17 is provided on the p-type magnetic semiconductor layer 1, and an electrode 18 is provided on the n-type magnetic semiconductor layer 2.

Specifically, through a MBE Process, a low-temperature grown buffer layer made of n-type GaN doped with Si at 400° C. was grown on an $Al_2O_3$ substrate, and doped with Cr while growing GaN thereon, to form an n-type half-metal ferromagnetic semiconductor layer. Then, an n-type cladding layer (multi-quantum well of GaN and $Al_{0.2}Ga_{0.8}$) was grown on the n-type semiconductor layer, and an active layer with a multi (quintuple)-quantum well structure made of InGaN and AlGaN crystallized with 5 to 20% of Al was formed on the n-type cladding layer. Then, a p-type cladding layer was formed on the active layer. A p-type half-metal ferromagnetic semiconductor layer of GaN:Mn doped with Mn at 750° C. was formed on the p-type cladding layer, and a Pt electrode was attached on the p-type semiconductor layer.

Figure 6:
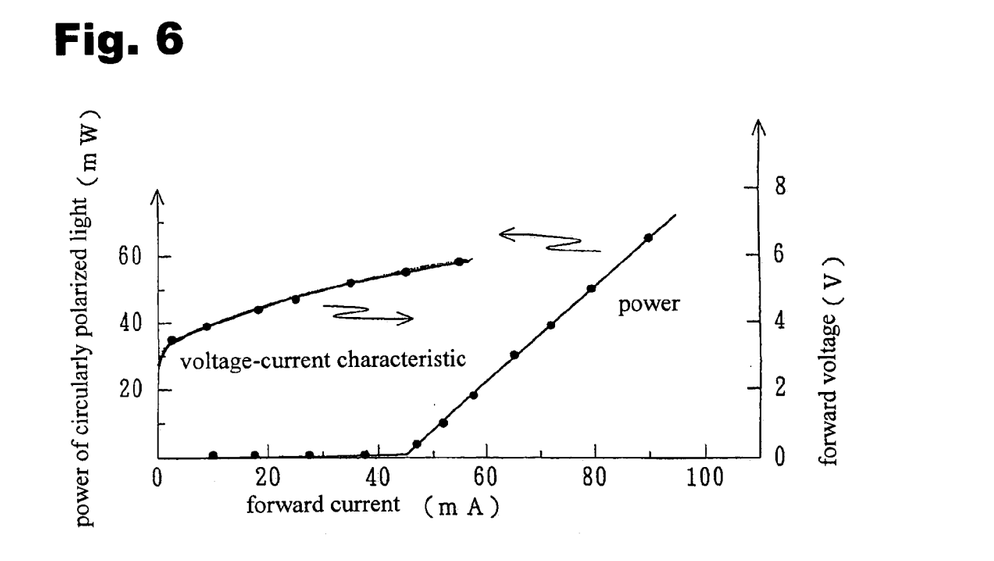
FIG. 6 is a graph showing current-voltage and current-power characteristics of the circular-polarization spin-based semiconductor laser source according to the second embodiment.

The laser oscillation of this circular-polarization spin-based semiconductor laser source was performed by injecting current thereinto. The respective dependences between current-power and voltage-current are shown in FIG. 6. As a result, a completely circularly polarized laser light was observed.

INDUSTRIAL APPLICABILITY

A conventional circular-polarization semiconductor laser source is designed such that a circularly polarized light is used to excite and spin-polarize electrons so as to generate a laser light. Due to light excitation, the degree of spin polarization induced by spin orbit interaction is low to result in a low circular polarization degree. Moreover, the excitation using a circularly polarized light leads to increase in size of the laser source so as to cause difficulties in achieve adequate downsizing required for incorporating the laser source into an associated device. The semiconductor laser source according to the present invention can control a polarization degree and obtain a completely circularly polarized laser light while facilitating reduction in size of the laser source. Thus, this semiconductor laser source can be applied to various devices.

What is claimed is:

1. A spin-based semiconductor laser source for generating a circularly polarized laser light, comprising:
   a pair of p-type and n-type half-metal ferromagnetic semiconductor layers each made of a magnetic semiconductor which has a matrix consisting of either one of zinc oxide (ZnO), group III-V compound semiconductor and group II-VI compound semiconductor, and contains a transition metal atom;
   an active layer having a multi-quantum well structure interposed between said p-type and n-type half-metal ferromagnetic semiconductor layers; and
   means for allowing a spin-polarized hole and a spin-polarized electron to be introduced into said active layer through current injection.

2. The spin-based semiconductor laser source as defined in claim 1, wherein each of said p-type and n-type half-metal ferromagnetic semiconductor layers has a source and drain provided thereon, and a gate provided thereto through an insulating layer, to utilize the field effect induced by a gate bias.

3. The spin-based semiconductor laser source as defined in claim 1, wherein each of said p-type and n-type half-metal ferromagnetic semiconductor layers are doped with an acceptor or a donor, and provided with an electrode.

4. A method of generating a laser light, comprising:
   preparing a spin-based semiconductor laser source for generating a circularly polarized laser light, comprising: a pair of p-type and n-type half-metal ferromagnetic semiconductor layers each made of a magnetic semiconductor which has a matrix consisting of either one of zinc oxide (ZnO), group III-V compound semiconductor and group II-VI compound semiconductor, and contains a transition metal atom: an active layer having a multi-Quantum well structure interposed between said p-type and n-type half-metal ferromagnetic semiconductor layers; and means for allowing a spin-polarized hole and a spin-polarized electron to be introduced into said active layer through current injection; and
   applying a different one of negative and positive voltages to said p-type and n-type half-metal ferromagnetic semiconductor layers to form a hole spin-polarized in a forward direction and an electron spin-polarized in a backward direction, respectively in said p-type and n-type half-metal ferromagnetic semiconductor layers, and inject said hole and electron into said active layer therefrom so as to cause the recombination between said hole and electron in said active layer to generate a circularly polarized laser light from said semiconductor laser source.

5. The method as defined in claim 4, wherein said voltage to be applied is varied to control the degree of spin polarization in each of said p-type and n-type half-metal ferromagnetic semiconductor layers so as to control the output energy and polarization degree of said circularly polarized laser light.

6. The method as defined in claim 4, wherein each of said p-type and n-type half-metal ferromagnetic semiconductor layers is provided with a gate, source and drain, wherein the magnitude of at least either one of said spin-polarized hole and electron flowing between said source and drain is varied to adjust/control the output energy of said circularly polarized laser light.

7. The method as defined in claim 4, which includes applying an external magnetic field to said semiconductor laser source to control the emission wavelength of said circularly polarized laser light.

8. The method as defined in claim 4, which includes varying said voltage to be applied, to control the emission wavelength of said circularly polarized laser light.

9. The method as defined in claim 4, wherein said laser source includes a superlattice structure in the barrier height of a spin-cladding layer disposed on a portion of each of said p-type and n-type half-metal ferromagnetic semiconductor layers adjacent to said active layer wherein said superlattice structure is adjusted to control the emission wavelength of said circularly polarized laser light.

10. The method as defined in claim 4, which includes adjusting the well width of said multi-quantum well structure and said voltage to be applied, to change the value g of said electron spin so as to vary the intensity of an external magnetic field applied said semiconductor laser source, to control the emission wavelength of said circularly polarized laser light.

11. A method of generating a laser light using the spin-based semiconductor laser source as defined in claim 2, wherein said source is formed by laminating a half-metal ferromagnetic semiconductor thin film and an antiferromagnetic multilayer film, so that the direction of the magnetic domain thereof is pinned to uniform the respective spin directions of electrons or holes to be injected from said source toward said drain.

12. A method of generating a laser light using the spin-based semiconductor laser source as defined in claim 2, wherein said source is made of a half-metal ferromagnetic semiconductor, and provided with a ferromagnetic permanent magnet for controlling the direction of the magnetic domain thereof, so that the direction of said magnetic domain is pinned to uniform the respective spin directions of electrons or holes to be injected from said source toward said drain.

13. The spin-based semiconductor laser source as defined in claim 2, wherein said source is formed by laminating a half-metal ferromagnetic semiconductor thin film and an antiferromagnetic multilayer film, so that the direction of the magnetic domain thereof is pinned to uniform the respective spin directions of electrons or holes to be injected from said source toward said drain.

14. The spin-based semiconductor laser source as defined in claim 2, wherein said source is made of a half-metal ferromagnetic semiconductor, and provided with a ferromagnetic permanent magnet for controlling the direction of the magnetic domain thereof, so that the direction of said magnetic domain is pinned to uniform the respective spin directions of electrons or holes to be injected from said source toward said drain.

* * * * *